(12) United States Patent
Yoon

(10) Patent No.: US 9,105,866 B2
(45) Date of Patent: Aug. 11, 2015

(54) ORGANIC LIGHT-EMITTING DIODE (OLED) DISPLAY

(71) Applicant: Samsung Display Co., Ltd., Yongin, Gyeonggi-Do (KR)

(72) Inventor: Joo-Sun Yoon, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/163,086

(22) Filed: Jan. 24, 2014

(65) Prior Publication Data

US 2015/0034913 A1 Feb. 5, 2015

(30) Foreign Application Priority Data

Aug. 5, 2013 (KR) .......................... 10-2013-0092650

(51) Int. Cl.
*H01L 29/08* (2006.01)
*H01L 51/52* (2006.01)

(52) U.S. Cl.
CPC .................................. *H01L 51/5203* (2013.01)

(58) Field of Classification Search
None
See application file for complete search history.

(56) References Cited

U.S. PATENT DOCUMENTS

| 6,900,470 | B2 | 5/2005 | Kobayashi et al. |
| 7,521,722 | B2 | 4/2009 | Yamazaki et al. |
| 2007/0108899 | A1 * | 5/2007 | Jung et al. ...................... 313/506 |

FOREIGN PATENT DOCUMENTS

| KR | 10-0729078 B1 | 6/2007 |
| KR | 10-0963075 B1 | 6/2010 |

* cited by examiner

*Primary Examiner* — Kyoung Lee
(74) *Attorney, Agent, or Firm* — Knobbe, Martens, Olson & Bear, LLP

(57) ABSTRACT

An organic light emitting-diode (OLED) display is disclosed. In one aspect, the OLED includes a first substrate, a first electrode provided on the first substrate, a pixel defining layer provided on the first electrode and including a first opening exposing at least a portion of the first electrode, and an organic emission layer provided on the first electrode corresponding to the first opening. The OLED display also includes a second electrode provided on the pixel defining layer and the organic emission layer, a second substrate provided on the second electrode, and a first auxiliary electrode provided below the second substrate facing the second electrode and welded to a portion of the second electrode corresponding to the pixel defining layer.

19 Claims, 5 Drawing Sheets

1000

ORGANIC LIGHT-EMITTING DIODE (OLED) DISPLAY

CROSS-REFERENCE TO RELATED APPLICATIONS

This application claims priority to and the benefit of Korean Patent Application No. 10-2013-0092650 filed in the Korean Intellectual Property Office on Aug. 5, 2013, the entire contents of which are incorporated herein by reference.

BACKGROUND

1. Field

The described technology generally relates to an organic light-emitting diode (OLED) display, and more particularly, to an OLED display for emitting light frontward and displaying an image.

2. Description of the Related Technology

Organic light-emitting diode (OLED) displays are receiving attention due to their unique characteristics.

OLED displays have self luminance and do not require a separate light source, unlike liquid crystal displays (LCDs), and thus can have a reduced thickness and weight. Further, OLED displays can have high quality characteristics such as low power consumption, high luminance, and a high response speeds.

A conventional OLED display includes an OLED having a substrate, a first electrode formed on the substrate, an organic emission layer disposed on the first electrode, and a second electrode disposed on the organic emission layer.

SUMMARY OF CERTAIN INVENTIVE ASPECTS

One inventive aspect is an organic light-emitting diode (OLED) display which can minimize the voltage drop of common power for driving an organic emission layer supplied through a thin film electrode.

Another aspect is an OLED display including a first substrate, a first electrode provided on the first substrate, a pixel defining layer provided on the first electrode and including a first opening exposing at least a portion of the first electrode, an organic emission layer provided on the first electrode corresponding to the first opening, a second electrode provided on the pixel defining layer and the organic emission layer, a second substrate provided on the second electrode, and a first auxiliary electrode provided on the second substrate facing the second electrode and welded to a portion of the second electrode corresponding to the pixel defining layer.

The OLED display further includes a spacer provided between the first auxiliary electrode and the second substrate corresponding to the portion of the second electrode.

The first auxiliary electrode is welded to the portion of the second electrode by irradiating an interface therebetween.

A common power is supplied to the first auxiliary electrode and the second electrode.

A plurality of first auxiliary electrodes are provided and the space between adjacent first auxiliary electrodes corresponds to the first opening.

The OLED display further includes a second auxiliary electrode corresponding to the first auxiliary electrode, provided on the same layer as the first electrode, and separated from the first electrode, wherein the pixel defining layer further includes a second opening exposing the second auxiliary electrode, and a portion of the second electrode contacts the second auxiliary electrode through the second opening.

The portion of the second electrode is interposed between the second auxiliary electrode and the first auxiliary electrode.

The portion of the second electrode is welded to the second auxiliary electrode.

The second auxiliary electrode electrically floats.

The first electrode includes an optically reflective electrode and the second electrode includes an optically transmissive electrode.

Another aspect is an organic light-emitting diode (OLED) display, comprising: a first substrate; a first electrode formed over the first substrate; a pixel defining layer formed over the first electrode and including a first opening exposing at least a portion of the first electrode; a second electrode formed over the pixel defining layer and the first electrode; and a first auxiliary electrode welded to a portion of the second electrode in an area corresponding to the pixel defining layer.

The above display further comprises: a spacer formed over the first auxiliary electrode; and a second substrate formed over the spacer. In the above display, the first auxiliary electrode and the second electrode are both electrically connected to a first power supply. The above display further comprises a second auxiliary electrode formed i) in the same layer as the first electrode and ii) in an area corresponding to the first auxiliary electrode, wherein the second auxiliary electrode is separated from the first electrode, wherein the pixel defining layer further includes a second opening exposing at least a portion of the second auxiliary electrode, and wherein the portion of the second electrode contacts the second auxiliary electrode through the second opening. In the above display, the portion of the second electrode is interposed between the first and second auxiliary electrodes. In the above display, the portion of the second electrode is welded to the second auxiliary electrode.

Another aspect is an organic light-emitting diode (OLED) display, comprising: a substrate; a pixel defining layer formed over the substrate; a plurality of pixels formed over the substrate, the pixels including a common electrode formed commonly over all of the pixels and the pixel defining layer; a first auxiliary electrode welded to a portion of the electrode in an area corresponding to the pixel defining layer.

In the above display, each pixel further includes a first electrode and wherein the pixel defining layer includes a first opening exposing at least a portion of the first electrode. In the above display, the first auxiliary electrode comprises a plurality of first auxiliary electrodes and wherein a space between adjacent first auxiliary electrodes corresponds to the first opening.

According to at least one embodiment, an OLED display is provided which can minimize the voltage drop of common power for driving an organic emission layer supplied through a thin film electrode.

DETAILED DESCRIPTION OF CERTAIN INVENTIVE EMBODIMENTS

Figure 1:
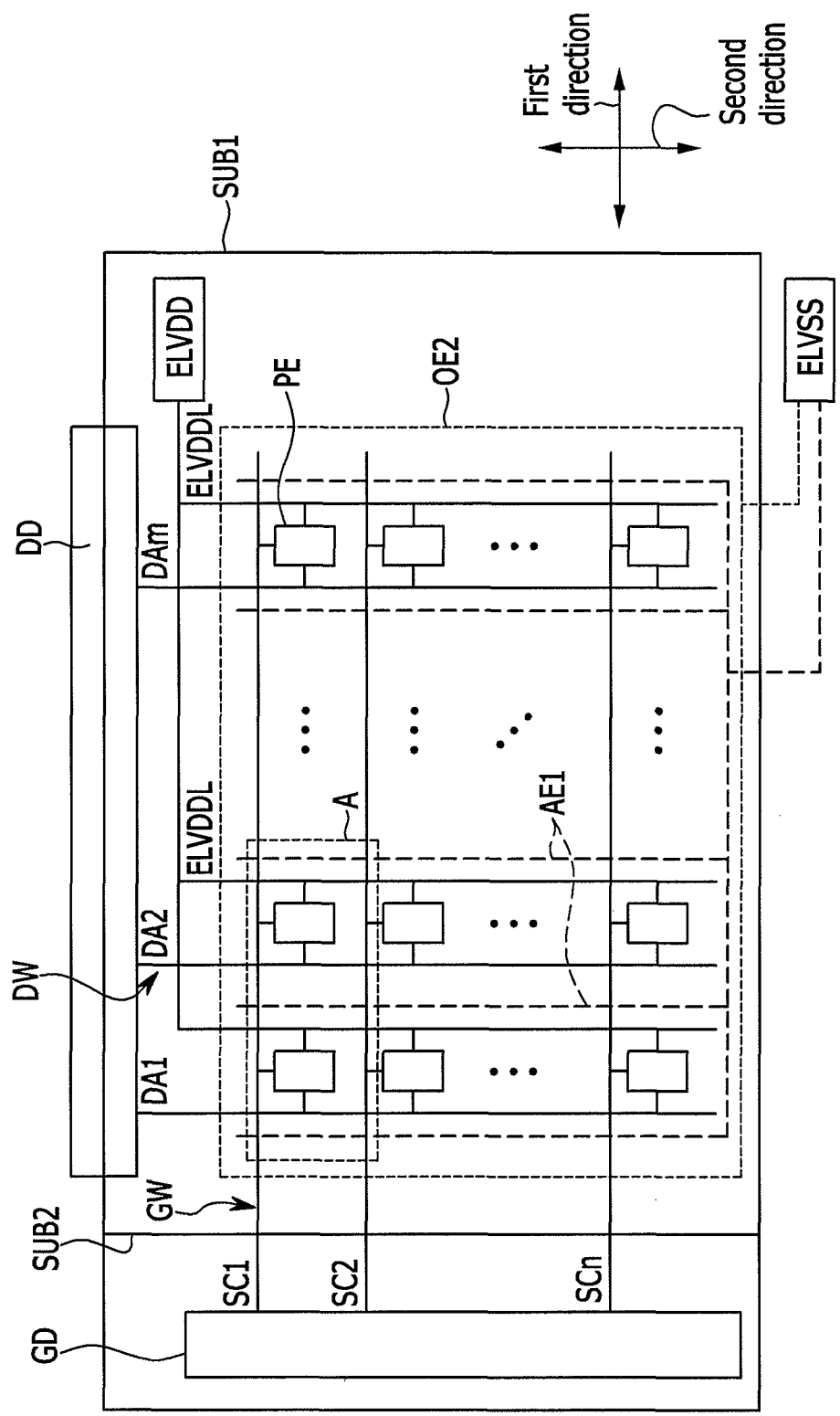
FIG. 1 shows an organic light-emitting diode (OLED) display according to a first exemplary embodiment.

OLED displays can be classified into front emission, rear emission, and dual emission. The typical front emission OLED display has a structure in which the second electrode of an OLED is formed over the entire area of a substrate and is formed as a thin film in order to minimize the absorption of light by the second electrode.

However, when the second electrode is a thin film formed over the entire area of the substrate of an OLED display, a voltage drop occurs in the driving power supplied through the second electrode due to electrical resistance of the second electrode.

In the following detailed description, only certain exemplary embodiments have been shown and described, simply by way of illustration. As those skilled in the art would realize, the described embodiments may be modified in various different ways, all without departing from the spirit or scope of the described technology.

Elements that are unrelated to the description of the exemplary embodiments are not shown so that the description of the described technology is clear. Like reference numerals designate like element throughout the specification.

The size and thickness of each component illustrated in the drawings are illustrated only for better understanding and ease of description, but the described technology is not limited to the illustrations.

In the drawings, the thickness of layers, films, panels, regions, etc., may be exaggerated for clarity. For example, the thickness of the layers, films, panels, regions, etc., may be enlarged in the drawings for better understanding and ease of description. It will be understood that when an element such as a layer, film, region, or substrate is referred to as being "on" another element, it can be directly on the other element or intervening elements may also be present. As used herein, the term "connected" includes the term "electrically connected."

Unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to the orientation of the device.

An OLED display according to a first exemplary embodiment will now be described with reference to FIG. 1 to FIG. 4.

FIG. 1 shows an OLED display according to a first exemplary embodiment.

As shown in FIG. 1, the OLED display 1000 includes a first substrate (SUB1), a second substrate (SUB2), a gate driver (GD), gate wires (GW), a data driver (DD), data wires (DW), a first auxiliary electrode (AE1), and a pixel (PE). Here, the pixel (PE) can be the minimum unit for displaying an image, and the OLED display 1000 displays an image through a plurality of pixels (PE).

The first substrate (SUB1) and the second substrate (SUB2) can be formed of a transparent insulation substrate made of glass, quartz, ceramic, or plastic. However, the described technology is not restricted thereto, and the first substrate (SUB1) and the second substrate (SUB2) can be formed of a metallic substrate made of stainless steel. Further, when the first substrate (SUB1) and the second substrate (SUB2) are made of plastic, the OLED display 1000 can be flexible, stretchable, or rollable. The first substrate (SUB1) faces the second substrate (SUB2), and they are attached by a sealant to seal the space between the first substrate (SUB1) and the second substrate (SUB2).

The gate driver (GD) sequentially supplies a scan signal to the gate wires (GW) in response to a control signal received from a control circuit (not shown), for example, a timing controller. The pixel (PE) is then selected by the scan signal and sequentially receives a data signal.

The gate wires (GW) are provided on the first substrate (SUB1) and extend in a first direction. The gate wires (GW) include scan lines (SC1-SCn) which are connected to the gate driver (GD) and receive the scan signal from the gate driver (GD).

According to some embodiments, the gate wires (GW) further include an additional scan line, a reset power supply line, and a light emission control line. In these cases, the OLED display can be a 6Tr-2Cap active matrix (AM) OLED display.

The data wires (DW) include data lines (DA1-Dam). The data driver (DD) supplies the data signal to data lines (DA1-DAm) in response to a control signal received from an external device such as a timing controller. The data signal supplied to the data line (DAm) is supplied to the pixel (PE) selected by the scan signal each time the scan signal is supplied to the scan line (SCn). The pixel (PE) charges to a voltage corresponding to the data signal and emits light with a corresponding luminance.

The data wires (DW) can be provided over the gate wires (GW) or between the gate wires (GW) and the first substrate (SUB1), and extend in a second direction crossing the first direction. The data wires (DW) include a data line (DAm) and a driving power line (ELVDDL). The data line (DAm) is connected to the data driver (DD) and receives the data signal from the data driver (DD). The driving power line (ELVDDL) is connected to an external first power source (ELVDD) and receives driving power from the first power source (ELVDD).

The first auxiliary electrode (AE1) is provided on a substantially planar surface of the second substrate (SUB2) facing a second electrode to be described later and is welded to a portion of the second electrode. The first auxiliary electrode (AE1) extends in the second direction on the second substrate (SUB2). There is a plurality of first auxiliary electrodes (AE1) provided between neighboring pixels (PE) and the first auxiliary electrodes (AE1) are separated from each other with the pixels (PE) therebetween. The first auxiliary electrodes (AE1) are connected to a second power source (ELVSS) and receive common power from the second power source (ELVSS). The first auxiliary electrodes (AE1) are disposed in the first direction. The first auxiliary electrodes (AE1) will now be described in detail.

According to the first exemplary embodiment, the first auxiliary electrodes (AE1) are disposed in the first direction and extend in the second direction. However, according to some embodiments, the first auxiliary electrodes (AE1) are disposed in the second direction and extend in the first direction. In these cases, the first auxiliary electrodes (AE1) are provided between neighboring pixels (PE) and form a mesh shape.

The pixels (PE) include an OLED provided in a region where the gate wires (GW) cross the data wires (DW) between the neighboring first auxiliary electrodes (AE1). The pixels (PE) emit light with a luminance which depends on a driving current corresponding to the data signal. The pixels (PE) also include a plurality of thin film transistors for controlling the driving current flowing to the OLED, and at least one capacitor. The thin film transistors and the at least one capacitor are connected to the gate wires (GW) and the data wires (DW), and the OLED is connected to the thin film transistors and the at least one capacitor. The OLED is connected between the first power source (ELVDD) and the second power source (ELVSS).

Figure 2:
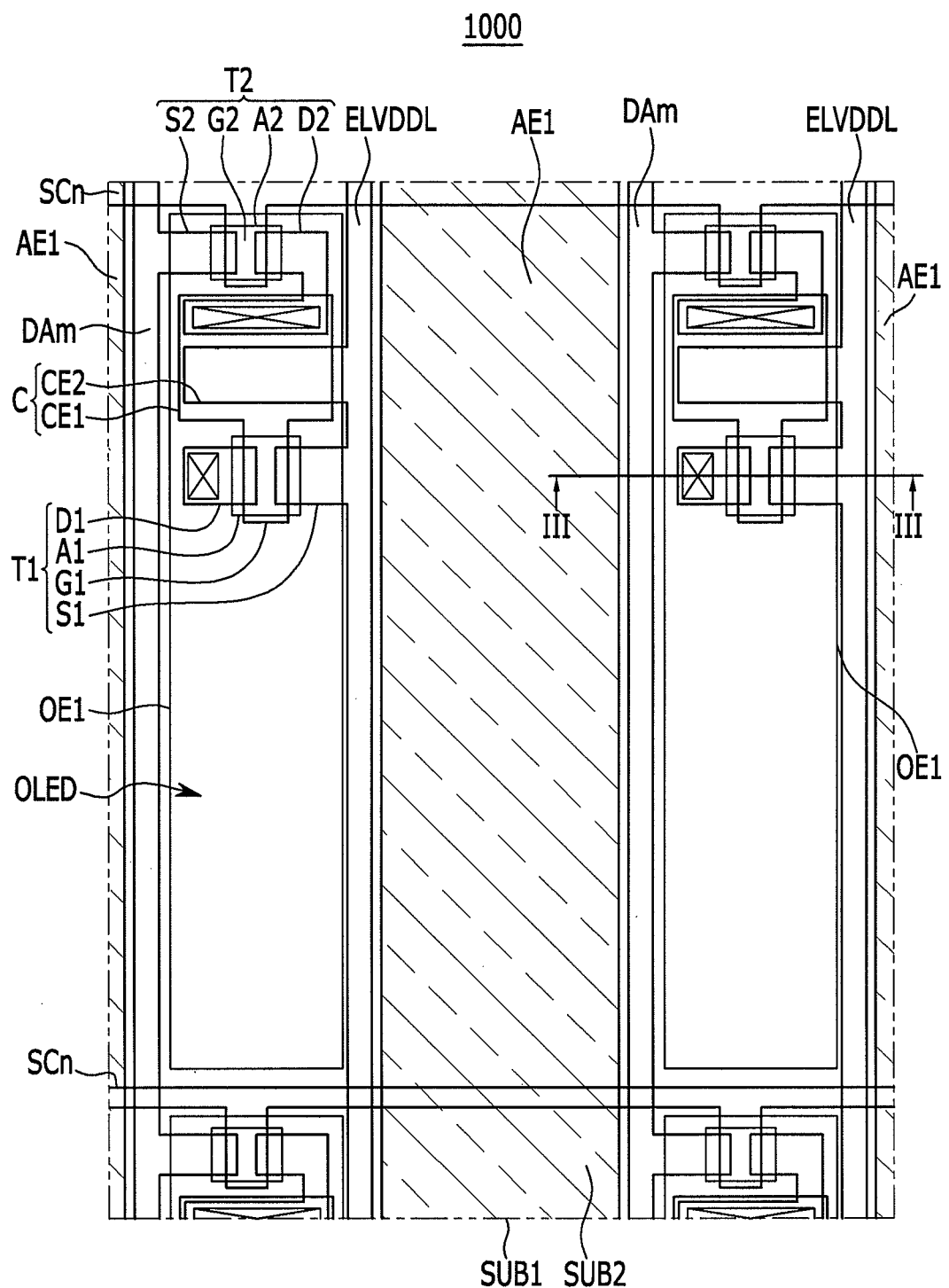
FIG. 2 shows a layout view of part A of FIG. 1.
Figure 3:
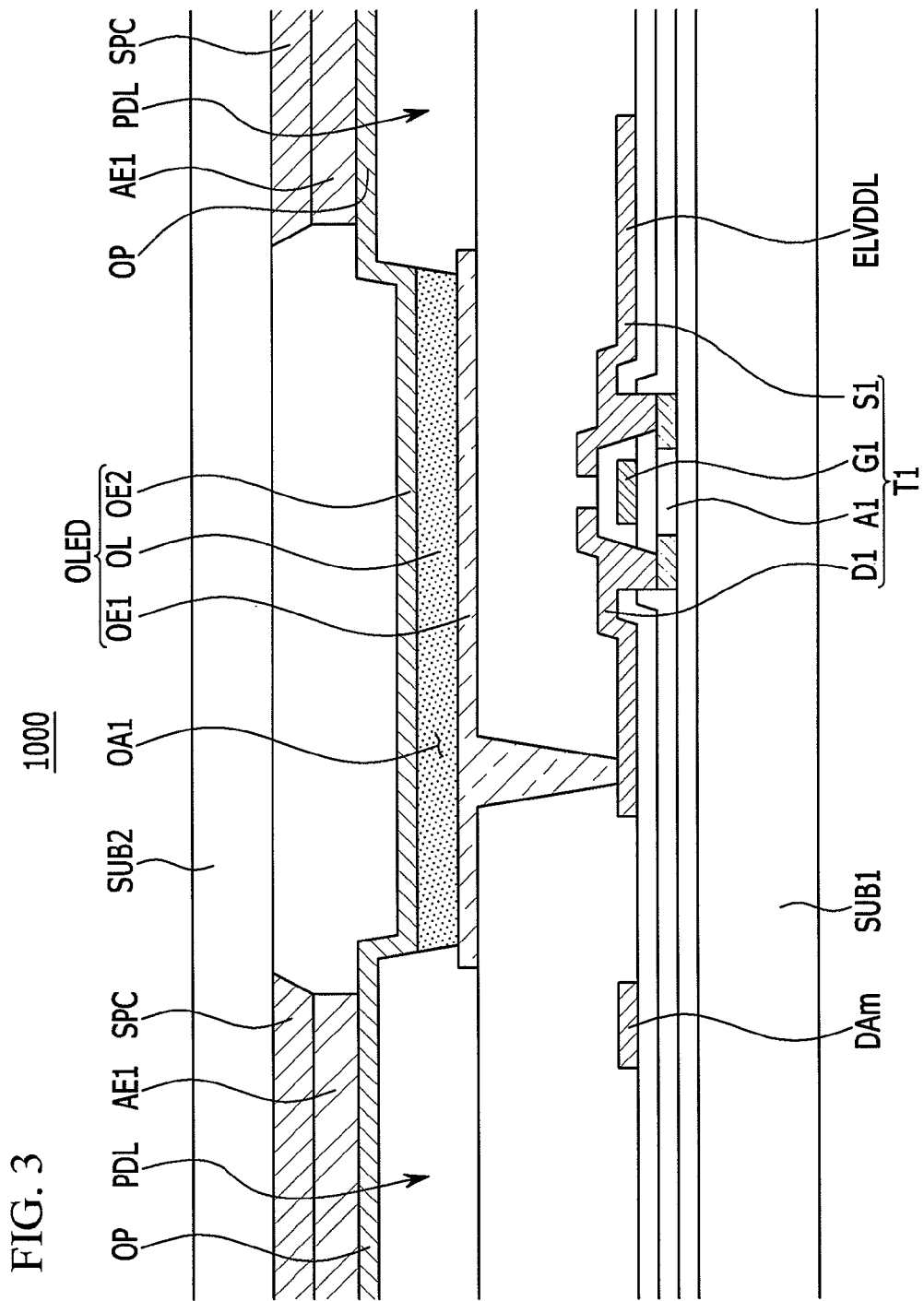
FIG. 3 shows a cross-sectional view with respect to line of FIG. 2.

FIG. 2 shows a layout view of part A of FIG. 1. FIG. 3 shows a cross-sectional view with respect to line of FIG. 2.

As shown in FIG. 2 and FIG. 3, the pixel (PE) includes an OLED connected between the first power source (ELVDD) and the second power source (ELVSS) and a pixel circuit including two thin film transistors and a capacitor connected between the OLED and the first power source (ELVDD). The pixel circuit controls the driving power supplied to the OLED. The OLED display 1000 further includes a pixel defining layer (PDL) and a spacer (SPC).

The pixel circuit includes a first thin film transistor (T1), a second thin film transistor (T2), and a capacitor (C).

The first thin film transistor (T1) is connected between the driving power line (ELVDDL) and a first electrode (OE1) of the OLED and supplies driving power corresponding to the data signal to the OLED from the first power source (ELVDD) during a light emission period of the pixel (PE). That is, the first thin film transistor (T1) functions as a driving transistor of the pixel (PE).

The first thin film transistor (T1) includes a first source electrode (S1), a first drain electrode (D1), a first active layer (A1), and a first gate electrode (G1).

The first source electrode (S1) is connected to the driving power line (ELVDDL) and the first drain electrode (D1) is separated from the first source electrode (S1) and is connected to the OLED. The first active layer (A1) is connected between the first drain electrode (D1) and the first source electrode (S1). The first source electrode (S1) and the first drain electrode (D1) can be formed on a different layer from the first active layer (A1). According to embodiments, the first source electrode (S1) and the first drain electrode (D1) can be formed on the same layer as the first active layer (A1). In these cases, impurities may be injected to the first source electrode (S1) and the first drain electrode (D1).

The first active layer (A1) is provided between the first source electrode (S1) and the first drain electrode (D1). The first active layer (A1) can be formed with a polysilicon or an oxide semiconductor. The oxide semiconductor can include an oxide that is made based on zinc (Zn), gallium (Ga), tin (Sn), or indium (In), or complex oxides thereof such as zinc oxide (ZnO), indium-gallium-zinc oxide (InGaZnO$_4$), indium-zinc oxide (Zn—In—O), or zinc-tin oxide (Zn—Sn—O). When the first active layer (A1) is formed with an oxide semiconductor, an additional protection layer for protecting the oxide semiconductor can be added to the first active layer (A1) since oxide semiconductors can be vulnerable to the external environment such as being exposed to a high temperature. The first active layer (A1) is divided into a channel region, a source region, and a drain region, and impurities may be injected into the source region and the drain region.

The first gate electrode (G1) is provided on the first active layer (A1) and is connected to the second drain electrode (D2) of the second thin film transistor (T2).

The second thin film transistor (T2) connects the data line (DAm) to the first thin film transistor (T1). The second thin film transistor (T2) transmits the data signal provided by the data line (DAm) to the pixel (PE) when a scan signal is supplied from the scan line (SCn). That is, the second thin film transistor (T2) functions as a switching transistor of the pixel (PE).

The second thin film transistor (T2) includes a second source electrode (S2), a second drain electrode (D2), a second active layer (A2), and a second gate electrode (G2).

The second source electrode (S2) is connected to the data line (DAm), and the second drain electrode (D2) is connected to the first gate electrode (G1) of the first thin film transistor (T1). The second source electrode (S2) and the second drain electrode (D2) can be formed on a different layer from the second active layer (A2). According to embodiments, the second source electrode (S2) and the second drain electrode (D2) can be formed on the same layer as the second active layer (A2). In these cases, impurities may be injected into the second source electrode (S2) and the second drain electrode (D2).

The second active layer (A2) is provided between the second source electrode (S2) and the second drain electrode (D2). The second active layer (A2) is provided on the same layer as the first active layer (A1) and the first substrate (SUB1), and is formed with the same material. The second active layer (A2) can be formed with a polysilicon or an oxide semiconductor. The second active layer (A2) is divided into a channel region, a source region, and a drain region, and impurities may be injected into the source region and the drain region.

The second gate electrode (G2) is formed on the second active layer (A2) and is connected to the scan line (SCn).

The capacitor (C) includes a first capacitor electrode (CE1) and a second capacitor electrode (CE2) facing each other with an insulation layer interposed therebetween. The second capacitor electrode (CE2) is connected to the driving power line (ELVDDL) and the first capacitor electrode (CE1) is connected to the second drain electrode (D2) and the first gate electrode (G1).

The OLED includes a first electrode (OE1), an organic emission layer (OL) provided on the first electrode (OE1), and a second electrode (OE2) provided on the organic emission layer (OL).

The first electrode (OE1) is an anode of the OLED and is connected to the driving power line (ELVDDL) through the pixel circuit. The second electrode (OE2) is a cathode of the OLED and is connected to the second power source (ELVSS).

There are a plurality of first electrodes (OE1) on the first substrate (SUB1) and the first electrodes (OE1) are separated from each other. Opposing ends of the first electrode (OE1) are covered by a pixel defining layer (PDL) and at least a portion of the first electrode (OE1) is exposed by the pixel defining layer (PDL). The first electrode (OE1) receives driving power from the first power source (ELVDD).

The second electrode (OE2) is provided on the outer surface of the first substrate (SUB1). The second electrode (OE2) is provided on the organic emission layer (OL) and the pixel defining layer (PDL). A portion (OP) of the second electrode (OE2) is welded to the first auxiliary electrode (AE1). The second electrode (OE2) receives the common power from the second power source (ELVSS).

The first electrode (OE1) and the second electrode (OE2) can be formed with an optically transmissive electrode or an optically reflective electrode. For example, the first electrode (OE1) can be formed with an optically reflective electrode, and the second electrode (OE2) can be formed with an optically transmissive electrode. In this case, light emitted by the organic emission layer (OL) is visible through the second electrode (OE2).

The organic emission layer (OL) of the OLED receives the driving power from the first power source (ELVDD) through the pixel circuit and emits light with a luminance that corresponds to the driving current flowing to the OLED when the common power is supplied from the second power source (ELVSS). The organic emission layer (OL) of the OLED can be formed with a low molecular organic material or a polymer organic material such as PEDOT (poly 3,4-ethylenedioxythiophene). Further, the organic emission layer (OL) may be formed as a multilayer including at least one of an emission layer, a hole injection layer (HIL), a hole transport layer (HTL), an electron transport layer (ETL), and an electron injection layer (EIL). When the multilayer includes each of the emission layers (HIL), (HTL), (ETL), and (EIL), the (HIL) is disposed on the first electrode (OE1), which is a positive electrode, and the (HTL), the emission layer, the (ETL), and the (EIL) are sequentially stacked thereon. The organic emission layer (OL) may include a red color organic emission layer which can emit red light, a green organic emission layer which can emit green light, and a blue organic emission layer which can emit blue light. The red, green, and blue organic emission layers are respectively formed in red, green, and blue color pixels to realize a colored image. According to some embodiments, the organic emission layer (OL) can include the red, green, and blue organic emission layers stacked together in each of the red, green, and blue color pixels. In these cases, red, green, and blue color filters are respectively provided in the color pixels. Alternatively, a white organic emission layer which can emit white light can be formed in each of the red, green, and blue color pixels and each of the color pixels can be respectively provided with red, green, and blue color filters. When a colored image is realized using the white organic emission layer and color filters, the resolution of the OLED display can be improved because deposition masks for the deposition of each of the red, green, and blue organic emission layers to the respective color pixels are not needed.

When the second thin film transistor (T2) is substantially instantaneously turned on, power is supplied to the second capacitor electrode (CE2) of the capacitor (C) from the driving power source line (ELVDDL) and at substantially the same time power is supplied to the first capacitor electrode (CE1) through the second thin film transistor (T2) from the data line (DAm) so that the capacitor (C) is charged. The amount of charge stored in the capacitor (C) is proportional to the voltage applied from the data line (Dam). The gate potential of the first thin film transistor (T1) is increased proportionally to the potential charged in the capacitor (C) while the second thin film transistor (T2) is in the turned off state. The first thin film transistor (T1) is turned on when the gate potential exceeds a threshold voltage. Then, the voltage applied to the driving power source line (ELVDDL) is applied to the OLED through the first thin film transistor (T1), and accordingly, the OLED emits light.

The structure of the pixel (PE) is not limited to the above description, but may be variously modified provided that such modifications can be easily appreciated and made by a person skilled in the art.

The pixel defining layer (PDL) is provided on the first electrode (OE1) and includes a first opening (OA1) which exposes at least a portion of the first electrode (OE1). The pixel defining layer (PDL) covers opposing ends of the first electrode (OE1) and substantially prevents a short-circuit between the first electrode (OE1) and the second electrode (OE2). The light emitting area of the pixel (PE) can be defined by the first opening (OA1) of the pixel defining layer (PDL).

The spacer (SPC) is provided between the first auxiliary electrode (AE1) and the second substrate (SUB2) corresponding to the portion (OP) of the second electrode (OE2). The spacer (SPC) can be formed with an organic material, an inorganic material, or a metal material, and it protrudes from the planar surface of the second substrate (SUB2) so that the first auxiliary electrode (AE1) may contact the portion (OP) of the second electrode (OE2).

The first auxiliary electrode (AE1) is provided on the planar surface of the second substrate (SUB2) facing the second electrode (OE2). The first auxiliary electrode (AE1) is welded to the portion (OP) of the second electrode (OE2) corresponding to the pixel defining layer (PDL). The first auxiliary electrode (AE1) can be formed of a different material than that of the second electrode (OE2). Therefore, the interface between the first auxiliary electrode (AE1) and the second electrode (OE2) is formed between two different materials.

A plurality of first auxiliary electrodes (AE1) are provided and a plurality of first openings (OA1) are provided between neighboring first auxiliary electrodes (AE1). That is, the first auxiliary electrodes (AE1) are provided between the first openings (OA1). The first openings (OA1) of the first auxiliary electrodes (AE1) correspond to the first openings of the pixel (OA1) of the pixel defining layer (PDL).

Figure 4:
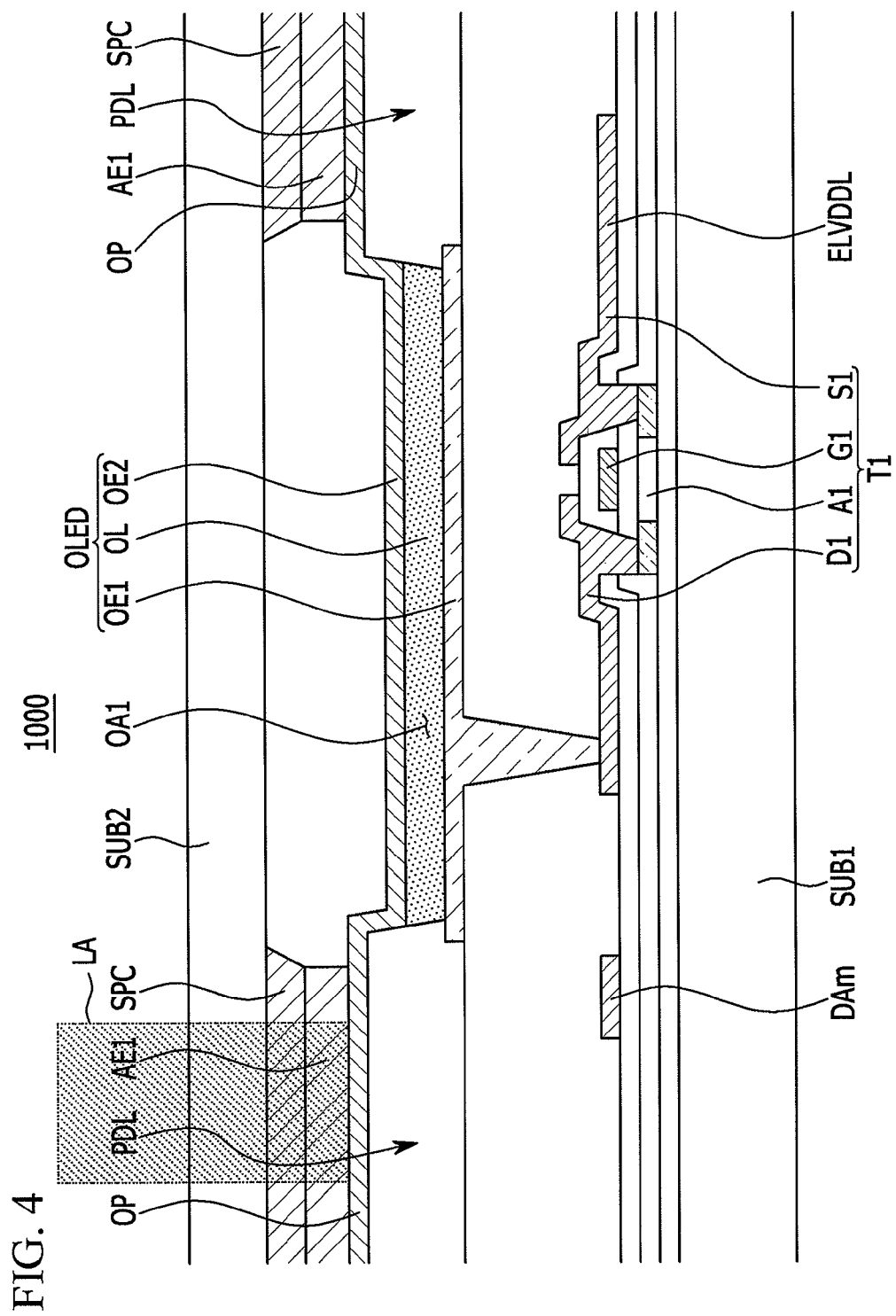
FIG. 4 shows a cross-sectional view of the welding of a first auxiliary electrode shown in FIG. 3 to a second electrode.

FIG. 4 shows a cross-sectional view of the welding of a first auxiliary electrode shown in FIG. 3 to a second electrode.

As shown in FIG. 4, the first auxiliary electrode (AE1) is welded to the portion (OP) of the second electrode (OE2) by irradiating laser beams (LA) through the second substrate (SUB2).

In detail, the second substrate (SUB2) is disposed on the first substrate (SUB1) and laser beams (LA) are irradiated to the interface between the first auxiliary electrode (AE1) and the portion (OP) of the second electrode (OE2) through the second substrate (SUB2) so the first auxiliary electrode (AE1) is welded to the portion (OP) of the second electrode (OE2). Thus, the first auxiliary electrode (AE1) is welded to the portion (OP) of the second electrode (OE2) by irradiating the interface therebetween.

As described above, the portion (OP) of the second electrode (OE2) corresponding to the pixel defining layer (PDL) contacts the first auxiliary electrode (AE1) provided on the second substrate (SUB2). The sheet resistance of the second electrode (OE2) over the entire OLED display 1000 is thereby reduced. Consequently, the voltage drop of common power supplied by the second power source (ELVSS) through the thin film second electrode (OE2) is minimized.

Further, according to at least one embodiment, the portion (OP) of the second electrode (OE2), is welded to the first auxiliary electrode (AE1) and the interface therebetween is between two different materials. Consequently, the contact resistance between the second electrode (OE2) and the first auxiliary electrode (AE1) is reduced. Accordingly, the sheet resistance of the second electrode (OE2) is reduced throughout the OLED display 1000, thereby minimizing the voltage drop of the common power passing through the second electrode (OE2).

In addition, according to at least one embodiment, substantially the same common power is supplied from the second power source (ELVSS) to both the first auxiliary electrode (AE1) and the second electrode (OE2) that are welded to each other thereby minimizing the voltage drop of the second power source (ELVSS) passing through the thin film second electrode (OE2).

That is, according to at least one embodiment, the voltage drop of a wide OLED display 1000 is minimized.

Further, according to at least one embodiment, the OLED display 1000 is a front-side emission display in which the first electrode (OE1) is an optically reflective electrode, the second electrode (OE2) is an optically transmissive electrode, and light emitted by the organic emission layer (OL) is visible through the second electrode (OE2). Further, the second electrode (OE2) is formed as a thin film, the first auxiliary electrode (AE1) is welded to the portion (OP) of the second electrode (OE2), and the sheet resistance of the second electrode (OE2) is reduced, thereby minimizing the voltage drop of the common power passing through the thin film second electrode (OE2). That is, a front side emission OLED display 1000 with a minimized voltage drop across the second electrode (OE2) formed with a large area is provided.

An OLED display according to a second exemplary embodiment will now be described with reference to FIG. 5.

Only elements that are different from the first exemplary embodiment will be described in detail. For better comprehension and ease of description, the constituent elements of the second exemplary embodiment that are substantially the same as the first exemplary embodiment will have the same reference numerals.

Figure 5:
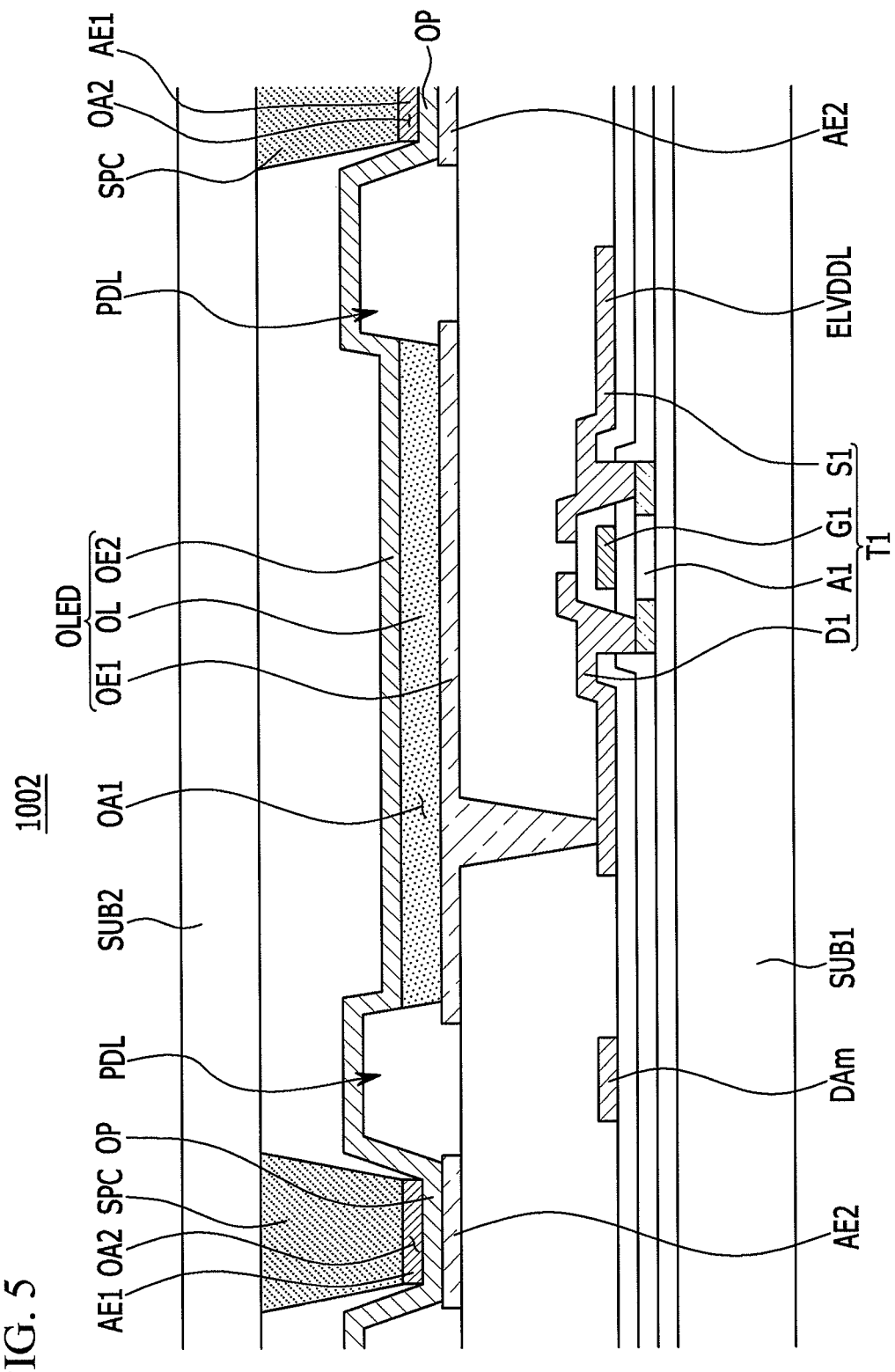
FIG. 5 shows a cross-sectional view of an OLED display according to a second exemplary embodiment.

FIG. 5 shows a cross-sectional view of an OLED display according to a second exemplary embodiment.

As shown in FIG. 5, the OLED display 1002 according to the second exemplary embodiment further includes a second auxiliary electrode (AE2) provided corresponding to the pixel defining layer (PDL).

The pixel defining layer (PDL) includes a first opening (OA1) and a second opening (OA2).

The second opening (OA2) exposes at least a portion of the second auxiliary electrode (AE2). The second opening (OA2) is provided corresponding to the first auxiliary electrode (AE1).

A portion (OP) of the second electrode (OE2) is welded to the first auxiliary electrode (AE1) and contacts the second auxiliary electrode (AE2) through the second opening (OA2). Also, a portion of the spacer (SPC) is provided inside the second opening (OA2) so that the first auxiliary electrode (AE1) may contact the portion (OP) of the second electrode (OE2) that is provided inside the second opening (OA2).

The second auxiliary electrode (AE2) is provided on the same layer as the first electrode (OE1) and is separated from the first electrode (OE1). The second auxiliary electrode (AE2) is disposed between neighboring first electrodes (OE1). The second auxiliary electrode (AE2) is welded to the portion (OP) of the second electrode (OE2) by laser welding as previously described. However, the describes technology is not limited to laser welding, the second auxiliary electrode (AE2) can contact the portion (OP) of the second electrode (OE2) without laser welding.

Further, the second auxiliary electrode (AE2) can be in an electrically floating state. However, the described technology is not limited thereto, the second auxiliary electrode (AE2) can be connected to the second power source (ELVSS) and can receive the common power from the second power source (ELVSS).

The portion (OP) of the second electrode (OE2) is provided between the second auxiliary electrode (AE2) and the first auxiliary electrode (AE1) and is welded to the first auxiliary electrode (AE1) and the second auxiliary electrode (AE2).

The portion (OP) of the second electrode (OE2) and the second auxiliary electrode (AE2) are formed of different materials. Consequently, the interface between the portion (OP) of the second electrode (OE2) and the second auxiliary electrode (AE2) is an interface between two different materials.

As described above, according to the second exemplary embodiment, since the portion (OP) of the second electrode (OE2) corresponding to the pixel defining layer (PDL) contacts the first auxiliary electrode (AE1) and the second auxiliary electrode (AE2), the sheet resistance of the second electrode (OE2) is reduced throughout the OLED display 1002 thereby minimizing the voltage drop of the common power passing through the thin film second electrode (OE2).

Further, according to at least one embodiment, since the portion (OP) of the second electrode (OE2) corresponding to the pixel defining layer (PDL) is welded to the first auxiliary electrode (AE1) and the second auxiliary electrode (AE2), the interfaces between the portion (OP) of the second electrode (OE2) and each of the first auxiliary electrode (AE1) and the second auxiliary electrode (AE2) is formed between different materials. Consequently, the contact resistance between the second electrode (OE2) and each of the first auxiliary electrode (AE1) and the second auxiliary electrode (AE2) is reduced. Accordingly, the sheet resistance of the second electrode (OE2) is reduced throughout the OLED display 1002 thereby minimizing the voltage drop of the common power passing through the thin film second electrode (OE2).

That is, an OLED display 1002 is provided with a minimized voltage drop over a wide second electrode thereon.

Further, according to at least one embodiment, the OLED display 1002 is configured as a front-side emission display in which the first electrode (OE1) is an optically reflective electrode, the second electrode (OE2) is an optically transmissive electrode, and light emitted from the organic emission layer (OL) is visible through the second electrode (OE2). Further, the second electrode (OE2) is formed to be a thin film, the first auxiliary electrode (AE1) and the second auxiliary electrode (AE2) are welded to the portion (OP) of the second electrode (OE2), and consequently, the sheet resistance of the second electrode (OE2) is reduced, thus minimizing the voltage drop of the common power passing through the thin film second electrode (OE2). That is, when the OLED display 1002 is formed to be wide and be a front-side emission display, the second electrode (OE2) has a minimized voltage drop.

While this described technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a first substrate;
    a first electrode formed over the first substrate;
    a pixel defining layer formed over the first electrode and including a first opening exposing at least a portion of the first electrode;
    an organic emission layer formed over the portion of the first electrode;
    a second electrode formed over the pixel defining layer and the organic emission layer;
    a second substrate formed over the second electrode; and
    a first auxiliary electrode formed below the second substrate and welded to a portion of the second electrode in an area corresponding to the pixel defining layer,
    wherein the first auxiliary electrode is formed of a different material than that of the second electrode, wherein the first auxiliary electrode is welded to the portion of the second electrode by irradiating an interface therebetween, and wherein the interface between the first auxiliary electrode and the second electrode includes two different materials formed by the welding.

2. The OLED display of claim 1, further comprising a spacer formed between the first auxiliary electrode and the second substrate.

3. The OLED display of claim 1, wherein the first auxiliary electrode and the second electrode are both electrically connected to a first power supply.

4. The OLED display of claim 1, wherein the first auxiliary electrode comprises a plurality of first auxiliary electrodes and wherein a space between adjacent first auxiliary electrodes corresponds to the first opening.

5. The OLED display of claim 1, wherein the first electrode comprises an optically reflective electrode and wherein the second electrode comprises an optically transmissive electrode.

6. An organic light-emitting diode (OLED) display, comprising:
   a first substrate;
   a first electrode formed over the first substrate;
   a pixel defining layer formed over the first electrode and including a first opening exposing at least a portion of the first electrode;
   an organic emission layer formed over the portion of the first electrode;
   a second electrode formed over the pixel defining layer and the organic emission layer;
   a second substrate formed over the second electrode;
   a first auxiliary electrode formed below the second substrate and welded to a portion of the second electrode in an area corresponding to the pixel defining layer; and 1
   a second auxiliary electrode formed i) in the same layer as the first electrode and ii) in an area corresponding to the first auxiliary electrode, wherein the second auxiliary electrode is separated from the first electrode, wherein the pixel defining layer further includes a second opening exposing the second auxiliary electrode, and wherein the portion of the second electrode contacts the second auxiliary electrode through the second opening.

7. The OLED display of claim 6, wherein the portion of the second electrode is interposed between the first and second auxiliary electrodes.

8. The OLED display of claim 7, wherein the portion of the second electrode is welded to the second auxiliary electrode.

9. The OLED display of claim 6, wherein the second auxiliary electrode electrically floats.

10. The OLED display of claim 6, wherein each of the second electrode and the first and second auxiliary electrodes is electrically connected to a first power supply.

11. An organic light-emitting diode (OLED) display, comprising:
   a first substrate;
   a first electrode formed over the first substrate;
   a pixel defining layer formed over the first electrode and including a first opening exposing at least a portion of the first electrode;
   a second electrode formed over the pixel defining layer and the first electrode; and
   a first auxiliary electrode welded to a portion of the second electrode in an area corresponding to the pixel defining layer,
   wherein the first auxiliary electrode is formed of a different material than that of the second electrode, wherein the first auxiliary electrode is welded to the portion of the second electrode by irradiating an interface therebetween, and wherein the interface between the first auxiliary electrode and the second electrode includes two different materials formed by the welding.

12. The OLED display of claim 11, further comprising:
   a spacer formed over the first auxiliary electrode; and
   a second substrate formed over the spacer.

13. The OLED display of claim 11, wherein the first auxiliary electrode and the second electrode are both electrically connected to a first power supply.

14. An organic light-emitting diode (OLED) display, comprising:
   a first substrate;
   a first electrode formed over the first substrate;
   a pixel defining layer formed over the first electrode and including a first opening exposing at least a portion of the first electrode;
   a second electrode formed over the pixel defining layer and the first electrode;
   a first auxiliary electrode welded to a portion of the second electrode in an area corresponding to the pixel defining layer; and
   a second auxiliary electrode formed i) in the same layer as the first electrode and ii) in an area corresponding to the first auxiliary electrode, wherein the second auxiliary electrode is separated from the first electrode, wherein the pixel defining layer further includes a second opening exposing at least a portion of the second auxiliary electrode, and wherein the portion of the second electrode contacts the second auxiliary electrode through the second opening.

15. The OLED display of claim 14, wherein the portion of the second electrode is interposed between the first and second auxiliary electrodes.

16. The OLED display of claim 15, wherein the portion of the second electrode is welded to the second auxiliary electrode.

17. An organic light-emitting diode (OLED) display, comprising:
   a substrate;
   a pixel defining layer formed over the substrate;
   a plurality of pixels formed over the substrate, the pixels including a common electrode formed commonly over all of the pixels and the pixel defining layer;
   a first auxiliary electrode welded to a portion of the common electrode in an area corresponding to the pixel defining layer,
   wherein the first auxiliary electrode is formed of a different material than that of the common electrode, wherein the first auxiliary electrode is welded to the portion of the common electrode by irradiating an interface therebetween, and wherein the interface between the first auxiliary electrode and the common electrode includes two different materials formed by the welding.

18. The OLED display of claim 17, wherein each pixel further includes a first electrode and wherein the pixel defining layer includes a first opening exposing at least a portion of the first electrode.

19. The OLED display of claim 18, wherein the first auxiliary electrode comprises a plurality of first auxiliary electrodes and wherein a space between adjacent first auxiliary electrodes corresponds to the first opening.

* * * * *